US010103424B2

(12) United States Patent
Noori et al.

(10) Patent No.: US 10,103,424 B2
(45) Date of Patent: Oct. 16, 2018

(54) ELECTRONIC DEVICE WITH MILLIMETER WAVE YAGI ANTENNAS

(71) Applicant: Apple Inc., Cupertino, CA (US)

(72) Inventors: Basim Noori, San Jose, CA (US); Ming-Ju Tsai, Cupertino, CA (US); Boon Wai Shiu, San Jose, CA (US); Matthew A. Mow, Los Altos, CA (US); Yuehui Ouyang, Sunnyvale, CA (US); Mattia Pascolini, San Francisco, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 83 days.

(21) Appl. No.: 15/138,684

(22) Filed: Apr. 26, 2016

(65) Prior Publication Data

US 2017/0309991 A1 Oct. 26, 2017

(51) Int. Cl.
*H01Q 1/24* (2006.01)
*H01Q 5/49* (2015.01)
(Continued)

(52) U.S. Cl.
CPC ........... *H01Q 1/243* (2013.01); *H01Q 1/2258* (2013.01); *H01Q 1/2266* (2013.01); *H01Q 1/241* (2013.01);
(Continued)

(58) Field of Classification Search
CPC ...... H01Q 1/2258; H01Q 1/2266; H01Q 1/24; H01Q 1/241; H01Q 1/242; H01Q 1/243; H01Q 19/30
See application file for complete search history.

(56) References Cited

U.S. PATENT DOCUMENTS 9,196,968 B2 * 11/2015 Ko ......................... H01Q 19/30
2007/0103377 A1 * 5/2007 Abramov .............. G06F 1/1616 343/818
(Continued)

FOREIGN PATENT DOCUMENTS

CN 101809814 A 8/2010
CN 101958456 A 1/2011
(Continued)

OTHER PUBLICATIONS

Grajek et al., "A 24-GHz High-Gain Yagi-Uda Antenna Array" IEEE Transactions on Antennas and Propagation, vol. 52, Issue: 5, May 10, 2004, DOI: 10.1109/TAP.2004.827543.
(Continued)

*Primary Examiner* — Hoang Nguyen
(74) *Attorney, Agent, or Firm* — Treyz Law Group, P.C.; G. Victor Treyz; Joseph F. Guihan

(57) ABSTRACT

An electronic device may be provided with wireless circuitry. The wireless circuitry may include one or more antennas. The antennas may include phased antenna arrays each of which includes multiple antenna elements. Phased antenna arrays may be formed from printed circuit board Yagi antennas or other antennas. A millimeter wave transceiver may use the antennas to transmit and receive wireless signals. The antennas may be mounted at the corners of an electronic device housing or elsewhere in an electronic device. An electronic device housing may be formed from metal and may have an opening filled with dielectric. The antennas may be aligned with portions of the dielectric. Printed circuit board antennas may have reflectors, radiators, and directors. The reflectors, radiators, and directors may be arranged to align radiation patterns for the antennas with the plastic-filled slots or other dielectric regions in the metal housing.

20 Claims, 9 Drawing Sheets

(51) Int. Cl.
*H01Q 15/14* (2006.01)
*H01Q 1/22* (2006.01)
*H01Q 19/30* (2006.01)

(52) U.S. Cl.
CPC ............... *H01Q 1/242* (2013.01); *H01Q 5/49* (2015.01); *H01Q 15/14* (2013.01); *H01Q 19/30* (2013.01)

(56) References Cited

U.S. PATENT DOCUMENTS

2011/0006953 A1* 1/2011 Chiang ................. G06F 1/1616 343/702
2011/0090131 A1 4/2011 Chen et al.
2013/0069837 A1* 3/2013 Cozzolino ............. H01Q 13/10 343/727
2013/0294485 A1* 11/2013 Ford ........................ H01Q 1/24 375/219
2014/0062823 A1 3/2014 Shor et al.
2014/0188191 A1 5/2014 Smith et al.
2015/0070228 A1 3/2015 Gu et al.
2015/0207216 A1* 7/2015 Fujita ................ H01L 23/49838 343/873
2015/0325922 A1* 11/2015 Fujita ..................... H01Q 19/06 343/753

FOREIGN PATENT DOCUMENTS

CN 102227036 A 10/2011
CN 104167592 A 11/2014

OTHER PUBLICATIONS

Wang et al, “60GHz Stacked Yagi Magneto-Electric Dipole Antenna with Wideband and High Gain Properties” Communication Problem-Solving (ICCP), 2015 IEEE International Conference on Oct. 16-18, 2015, DOI: 10.1109/ICCPS.2015.7454200.

* cited by examiner

ELECTRONIC DEVICE WITH MILLIMETER WAVE YAGI ANTENNAS

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

It may be desirable to support wireless communications in millimeter wave communications bands. Millimeter wave communications, which are sometimes referred to as extremely high frequency (EHF) communications, involve communications at frequencies of about 10-400 GHz. Operation at these frequencies may support high bandwidths, but may raise significant challenges. For example, millimeter wave communications are often line-of-sight communications and can be characterized by substantial attenuation during signal propagation.

It would therefore be desirable to be able to provide electronic devices with improved wireless communications circuitry such as communications circuitry that supports millimeter wave communications.

SUMMARY

An electronic device may be provided with wireless circuitry. The wireless circuitry may include one or more antennas. The antennas may include phased antenna arrays each of which includes multiple antenna elements. The phased antenna arrays may be used to handle millimeter wave wireless communications and may perform beam steering operations.

Antennas such as antennas in phased antenna arrays may be mounted at the corners of a housing for the electronic device or elsewhere in an electronic device. The antennas may be printed circuit board antennas formed from patterned metal traces on printed circuit board substrates.

The printed circuit board antennas may include Yagi antennas. Each Yagi antenna may have a reflector, a radiator, and one or more directors. The electronic device may have a metal housing with dielectric regions. The dielectric regions may be plastic-filled slots in the metal housing or other dielectric areas. The reflector, radiator, and directors may be configured so that each antenna has a radiation pattern that is aligned with a respective portion of the dielectric in the metal housing. In printed circuit boards with multiple substrate layers, different directors in an antenna may be embedded between different respective pairs of the substrate layers to form vertically oriented or diagonally oriented radiation patterns. The directors of an antenna may also be formed along the surface of a printed circuit board so that the antenna exhibits a horizontally oriented radiation pattern.

DETAILED DESCRIPTION

Figure 1:
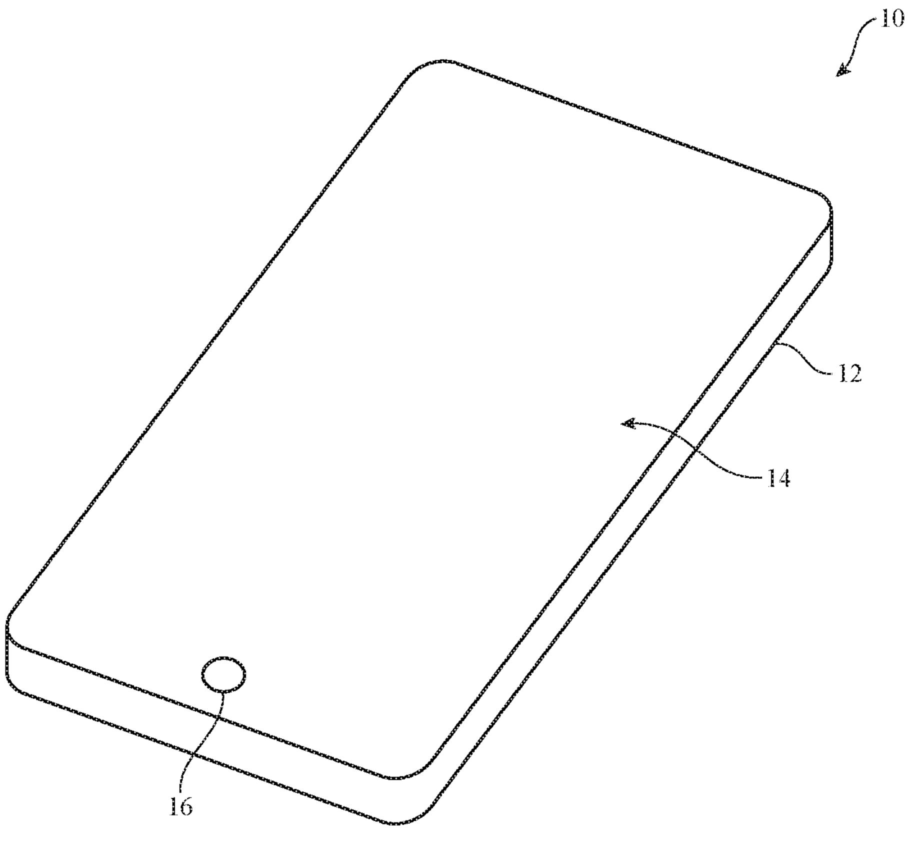
FIG. 1 is a perspective view of an illustrative electronic device with wireless communications circuitry in accordance with an embodiment.

An electronic device such as electronic device 10 of FIG. 1 may contain wireless circuitry. The wireless circuitry may include one or more antennas. The antennas may include phased antenna arrays that are used for handling millimeter wave communications. Millimeter wave communications, which are sometimes referred to as extremely high frequency (EHF) communications, involve signals at 60 GHz or other frequencies between about 10 GHz and 400 GHz. If desired, device 10 may also contain wireless communications circuitry for handling satellite navigation system signals, cellular telephone signals, local wireless area network signals, near-field communications, light-based wireless communications, or other wireless communications.

Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

As shown in FIG. 1, device 10 may include a display such as display 14. Display 14 may be mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer such as a layer of transparent glass, clear plastic, sapphire, or other transparent dielectric. Openings may be formed in the display cover layer. For example, an opening may be formed in the display cover layer to accommodate a button such as button 16. An opening may also be formed in the display cover layer to accommodate ports such as a speaker port. Openings may be formed in housing 12 to form communications ports (e.g., an audio jack port, a digital data port, etc.). Openings in housing 12 may also be formed for audio components such as a speaker and/or a microphone.

Antennas may be mounted in housing 12. To avoid disrupting communications when an external object such as a human hand or other body part of a user blocks one or more antennas, antennas may be mounted at multiple locations in housing 12. Sensor data such as proximity sensor data, real-time antenna impedance measurements, signal quality measurements such as received signal strength information, and other data may be used in determining when one or more antennas is being adversely affected due to the orientation of housing 12, blockage by a user's hand or other external object, or other environmental factors. Device 10 can then switch one or more replacement antennas into use place of the antennas that are being adversely affected.

Antennas may be mounted at the corners of housing 12, along the peripheral edges of housing 12, on the rear of housing 12, under the display cover glass or other dielectric display cover layer that is used in covering and protecting display 14 on the front of device 10, under a dielectric window on a rear face of housing 12 or the edge of housing 12, or elsewhere in device 10.

Figure 2:
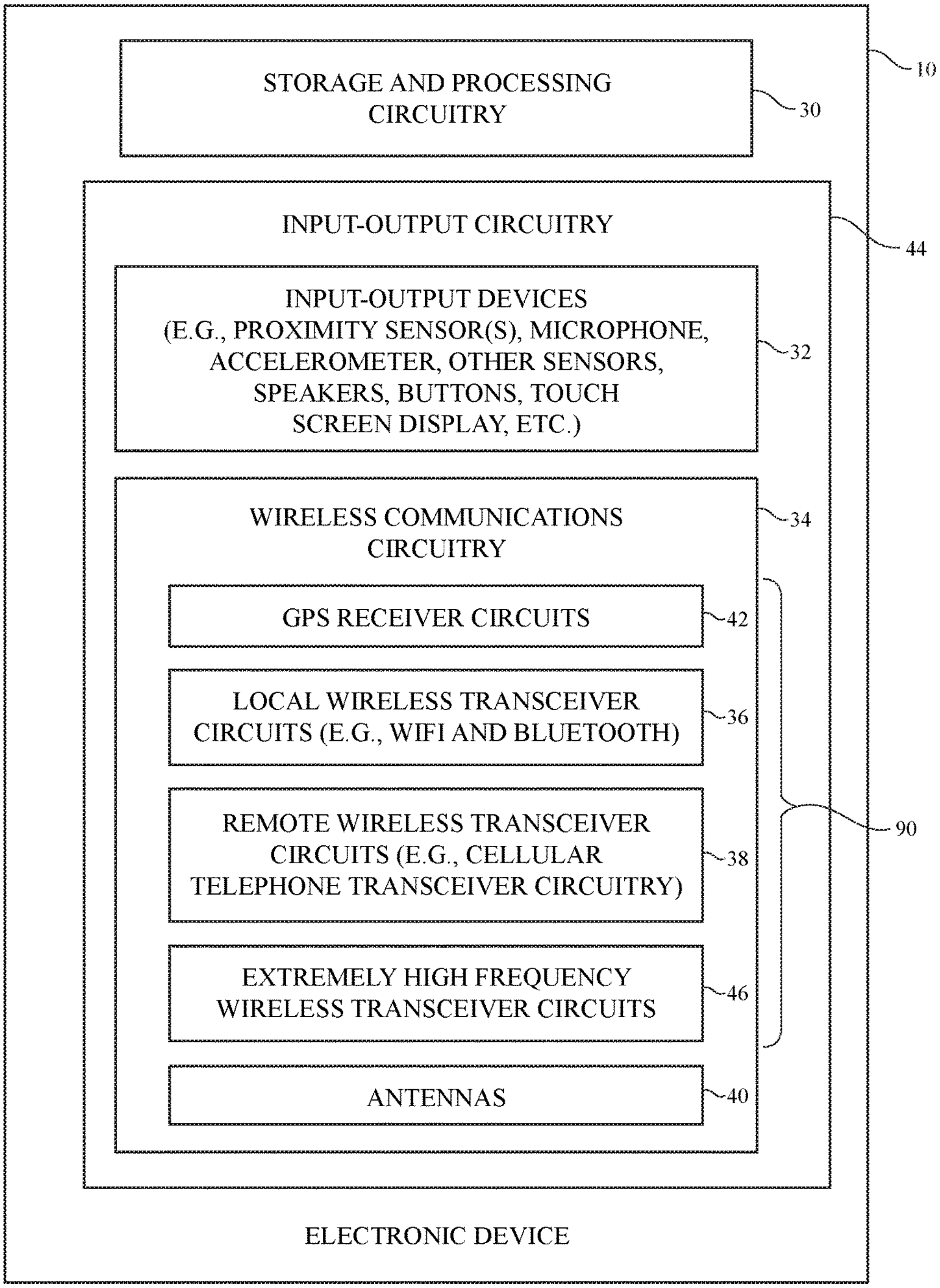
FIG. 2 is a schematic diagram of an illustrative electronic device with wireless communications circuitry in accordance with an embodiment.

A schematic diagram showing illustrative components that may be used in device 10 is shown in FIG. 2. As shown in FIG. 2, device 10 may include control circuitry such as storage and processing circuitry 30. Storage and processing circuitry 30 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 30 may be used to control the operation of device 10. This processing circuitry may be based on one or more microprocessors, microcontrollers, digital signal processors, baseband processor integrated circuits, application specific integrated circuits, etc.

Storage and processing circuitry 30 may be used to run software on device 10, such as internet browsing applications, voice-over-internet-protocol (VOIP) telephone call applications, email applications, media playback applications, operating system functions, etc. To support interactions with external equipment, storage and processing circuitry 30 may be used in implementing communications protocols. Communications protocols that may be implemented using storage and processing circuitry 30 include internet protocols, wireless local area network protocols (e.g., IEEE 802.11 protocols—sometimes referred to as WiFi®), protocols for other short-range wireless communications links such as the Bluetooth® protocol, cellular telephone protocols, MIMO protocols, antenna diversity protocols, satellite navigation system protocols, etc.

Device 10 may include input-output circuitry 44. Input-output circuitry 44 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, accelerometers or other components that can detect motion and device orientation relative to the Earth, capacitance sensors, proximity sensors (e.g., a capacitive proximity sensor and/or an infrared proximity sensor), magnetic sensors, a connector port sensor or other sensor that determines whether device 10 is mounted in a dock, and other sensors and input-output components.

Input-output circuitry 44 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas 40, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, 42, and 46.

Transceiver circuitry 36 may be wireless local area network transceiver circuitry that may handle 2.4 GHz and 5 GHz bands for WiFi® (IEEE 802.11) communications and that may handle the 2.4 GHz Bluetooth® communications band.

Circuitry 34 may use cellular telephone transceiver circuitry 38 for handling wireless communications in frequency ranges such as a low communications band from 700 to 960 MHz, a midband from 1710 to 2170 MHz, and a high band from 2300 to 2700 MHz or other communications bands between 700 MHz and 2700 MHz or other suitable frequencies (as examples). Circuitry 38 may handle voice data and non-voice data.

Millimeter wave transceiver circuitry 46 (sometimes referred to as extremely high frequency transceiver circuitry) may support communications at extremely high frequencies (e.g., millimeter wave frequencies such as extremely high frequencies of 10 GHz to 400 GHz or other millimeter wave frequencies). For example, circuitry 46 may support IEEE 802.11ad communications at 60 GHz.

Wireless communications circuitry 34 may include satellite navigation system circuitry such as Global Positioning System (GPS) receiver circuitry 42 for receiving GPS signals at 1575 MHz or for handling other satellite positioning data (e.g., GLONASS signals at 1609 MHz). Satellite navigation system signals for receiver 42 are received from a constellation of satellites orbiting the earth.

In satellite navigation system links, cellular telephone links, and other long-range links, wireless signals are typically used to convey data over thousands of feet or miles. In WiFi® and Bluetooth® links at 2.4 and 5 GHz and other short-range wireless links, wireless signals are typically used to convey data over tens or hundreds of feet. Extremely high frequency (EHF) wireless transceiver circuitry 46 may convey signals over these short distances that travel between transmitter and receiver over a line-of-sight path. To enhance signal reception for millimeter wave communications, phased antenna arrays and beam steering techniques may be used. Antenna diversity schemes may also be used to ensure that the antennas that have become blocked or that are otherwise degraded due to the operating environment of device 10 can be switched out of use and higher-performing antennas used in their place.

Wireless communications circuitry 34 can include circuitry for other short-range and long-range wireless links if desired. For example, wireless communications circuitry 34 may include circuitry for receiving television and radio signals, paging system transceivers, near field communications (NFC) circuitry, etc.

Antennas 40 in wireless communications circuitry 34 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, Yagi (Yagi-Uda) antenna structures, hybrids of these designs, etc. If desired, one or more of antennas 40 may be cavity-backed antennas. Different types of antennas may be used for different bands and combinations of bands. For example, one type of antenna may be used in forming a local wireless link antenna and another type of antenna may be used in forming a remote wireless link antenna. Dedicated antennas may be used for receiving satellite navigation system signals or, if desired, antennas 40 can be configured to receive both satellite navigation system signals and signals for other communications bands (e.g., wireless local area network signals and/or cellular telephone signals). Antennas 40 can include phased antenna arrays for handling millimeter wave communications.

Transmission line paths may be used to route antenna signals within device 10. For example, transmission line paths may be used to couple antenna structures 40 to transceiver circuitry 90. Transmission lines in device 10 may include coaxial cable paths, microstrip transmission lines, stripline transmission lines, edge-coupled microstrip transmission lines, edge-coupled stripline transmission lines, transmission lines formed from combinations of transmission lines of these types, etc. Filter circuitry, switching circuitry, impedance matching circuitry, and other circuitry may be interposed within the transmission lines, if desired.

Device 10 may contain multiple antennas 40. The antennas may be used together or one of the antennas may be switched into use while other antenna(s) are switched out of use. If desired, control circuitry 30 may be used to select an optimum antenna to use in device 10 in real time and/or to select an optimum setting for adjustable wireless circuitry associated with one or more of antennas 40. Antenna adjustments may be made to tune antennas to perform in desired frequency ranges, to perform beam steering with a phased antenna array, and to otherwise optimize antenna performance. Sensors may be incorporated into antennas 40 to gather sensor data in real time that is used in adjusting antennas 40.

In some configurations, antennas 40 may include antenna arrays (e.g., phased antenna arrays to implement beam steering functions). For example, the antennas that are used in handling millimeter wave signals for extremely high frequency wireless transceiver circuits 46 may be implemented as phased antenna arrays. The radiating elements in a phased antenna array for supporting millimeter wave communications may be patch antennas, dipole antennas, Yagi antennas (sometimes referred to as beam antennas), or other suitable antenna elements. Transceiver circuitry can be integrated with the phased antenna arrays to form integrated phased antenna array and transceiver circuit modules.

In devices such as handheld devices, the presence of an external object such as the hand of a user or a table or other surface on which a device is resting has a potential to block wireless signals such as millimeter wave signals. Accordingly, it may be desirable to incorporate multiple phased antenna arrays into device 10, each of which is placed in a different location within device 10. With this type of arrangement, an unblocked phased antenna array may be switched into use and, once switched into use, the phased antenna array may use beam steering to optimize wireless performance. Configurations in which antennas from one or more different locations in device 10 are operated together may also be used.

Figure 3:
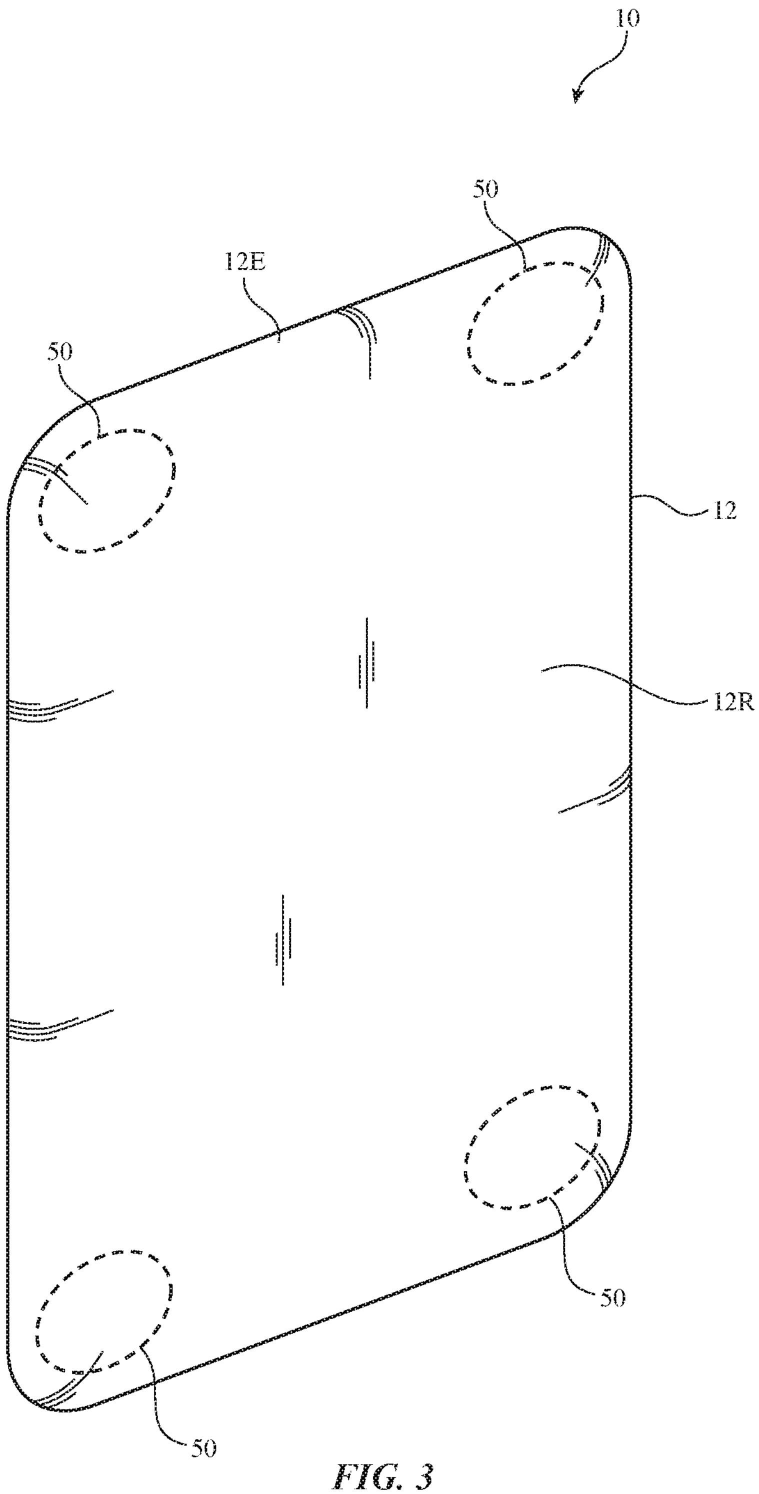
FIG. 3 is a rear perspective view of an illustrative electronic device showing illustrative locations at which antenna arrays for millimeter wave communications may be located in accordance with an embodiment.

FIG. 3 is a perspective view of electronic device showing illustrative locations 50 in which antennas 40 (e.g., single antennas and/or phased antenna arrays for use with wireless circuitry 34 such as millimeter wave wireless transceiver circuitry 46) may be mounted in device 10. Antennas 40 may be mounted at the corners of device 10, along the edges of housing 12 such as edge 12E, on upper and lower portions of rear housing portion (wall) 12R, in the center of rear housing wall 12R (e.g., under a dielectric window structure or other antenna window in the center of rear housing 12R), etc. As shown in FIG. 3, for example, antennas 40 may be located at the corners of housing 12 (i.e., locations 50 may be formed on the upper left corner, upper right corner, lower left corner, and lower right corner of housing 12 and device 10).

In configurations in which housing 12 is formed entirely or nearly entirely from a dielectric, antennas 40 may transmit and receive antenna signals through any suitable portion of the dielectric. In configurations in which housing 12 is formed from a conductive material such as metal, regions of the housing such as slots or other openings in the metal may be filled with plastic or other dielectric. Antennas 40 may be mounted in alignment with the dielectric in the openings. These openings, which may sometimes be referred to as dielectric antenna windows, dielectric gaps, dielectric-filled openings, dielectric-filled slots, elongated dielectric opening regions, etc., may allow antenna signals to be transmitted to external equipment from antennas 40 mounted within the interior of device 10 and may allow internal antennas 40 to receive antenna signals from external equipment.

In devices with phased antenna arrays, circuitry 90 may include gain and phase adjustment circuitry that is used in adjusting the signals associated with each antenna 40 in an array (e.g., to perform beam steering). Switching circuitry may be used to switch desired antennas 40 into and out of use. Each of locations 50 may include multiple antennas 40 (e.g., a set of three antennas or more than three or fewer than three antennas in a phased antenna array) and, if desired, one or more antennas from one of locations 50 may be used in transmitting and receiving signals while using one or more antennas from another of locations 50 in transmitting and receiving signals.

Figure 4:
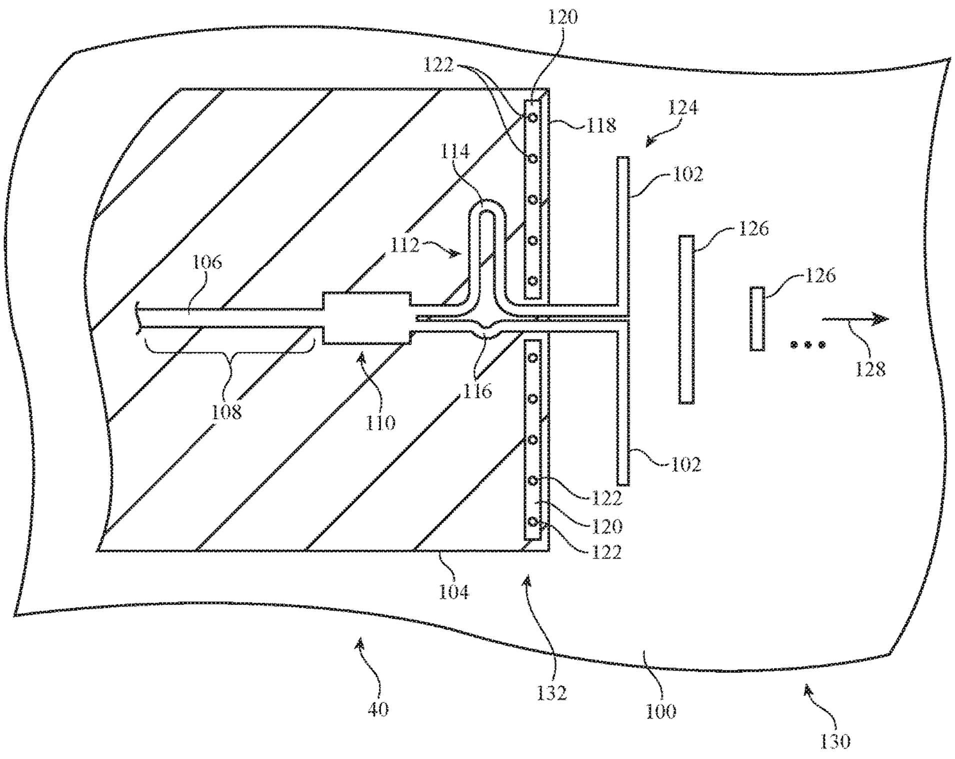
FIG. 4 is a diagram of an illustrative Yagi antenna of the type that may be used in an electronic device in accordance with an embodiment.

Antennas 40 may have any suitable configuration. In the illustrative configuration of FIG. 4, for example, antenna 40 is a Yagi antenna. As shown in FIG. 4, antenna 40 may be a Yagi printed circuit board antenna formed from printed circuit board 130. Printed circuit board 130 may have a printed circuit substrate such as substrate 100. Substrate 100 may be a rigid printed circuit board substrate (e.g., a substrate formed from fiberglass-filled epoxy or other rigid printed circuit board substrate material) or may be a flexible printed circuit substrate (e.g., a substrate formed from a sheet of flexible polymer such as a flexible polyimide layer). Substrate 100 may be form one or more dielectric layers. Other types of substrate may be used as a support structure for antenna 40, if desired. The configuration of FIG. 4 in which substrate 100 is a printed circuit board substrate (i.e., in which printed circuit 130 is a rigid printed circuit board) is merely illustrative.

Yagi antenna 40 includes reflector 132, radiator 124, and one or more directors 126. Radiator (driven element) 124 may be formed from dipole resonating element arms 102 and may transmit and receive antenna signals during operation of antenna 40. The presence of reflector 132 and directors 126 enhances the directionality of antenna 40 so that the radiation pattern for antenna 40 is directed in a desired direction, such as direction 128.

Printed circuit board 130 may contain one or more patterned layers of metal traces for forming antenna 40. For example, directors 126 and dipole arms 102 of radiator 124 may be formed from strip-shaped metal traces (i.e., parallel strips of metal) on substrate 100. Antenna signals may be conveyed between transceiver circuitry 90 and antenna 40 using a transmission line path such as transmission line 108 that is formed from metal trace 106 and ground plane 104. In portion 112 of antenna 124, path 114 is longer than path 116 to impose a 180° phase shift on the signals passing through path 116 for satisfactory Yagi antenna operation. Portion 110 of the signal path feeding antenna 40 may be widened relative to other traces 106 in transmission line 108 to form a transformer impedance that helps match the impedance of transmission line 108 (e.g., 50 ohms) to the impedance of radiator 124 (e.g., 170-180 ohms).

Edge 118 of ground plane 104 may run parallel to arms 102 of radiator 124 and may be used in forming reflector 132. Reflector 132 may also include optional metal traces (e.g., metal traces in another layer of printed circuit 130) such as strip-shaped metal traces 120. Metal traces 120 may be shorted to ground 104 through vias 122 that pass through one or more layers of printed circuit board material in substrate 100.

Figure 5:
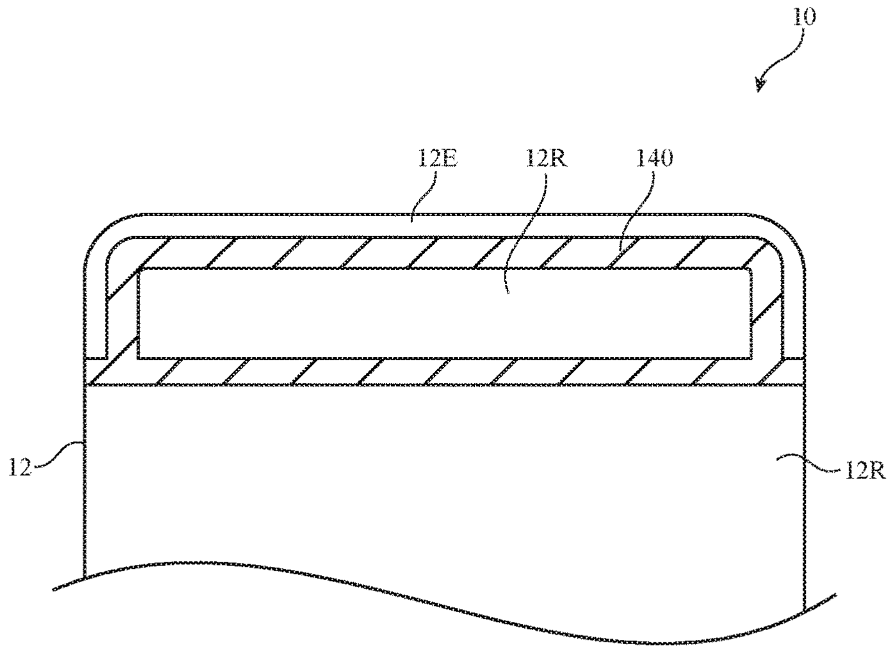
FIG. 5 is a rear view of illustrative electronic device with a metal housing and dielectric such as plastic-filled slots in the housing to accommodate wireless circuitry in accordance with an embodiment.

A rear view of device 10 in an illustrative configuration in which housing 12 (e.g., rear housing wall 12R and/or housing sidewall 12E) has been formed from metal is shown in FIG. 5. In the example of FIG. 5, device 10 includes dielectric-filled slots (gaps) 140 that separate portions of rear housing wall 12R and/or sidewall housing wall 12E from each other. There are two elongated slots 140 at one illustrative end of housing 12 in the example of FIG. 5, but this is merely illustrative. There may be one elongated strip-shaped opening in metal housing 12, two elongated strip-shaped openings in metal housing 12, or three or more strip-shaped openings in metal housing 12, or other patterns of slots or other openings. These patterns of openings (e.g., the slots of FIG. 5) may be formed at one or both ends of housing 12. Gaps and other openings in housing 12 may also have non-elongated shapes, may have shapes with combinations of straight and curved edges, may form rectangular areas, may form circular areas, or may form areas with other shapes. These openings in housing 12 may pass entirely through the metal wall structure that forms housing 12 (e.g., these openings may pass from an outer surface of housing wall 12 to an inner surface of housing wall 12). If desired, a metal housing in device 10 may also include shallow grooves or other regions that have plastic or other dielectric but that do not pass entirely through the metal housing.

Portions of dielectric-filled slots that pass through housing 12 such as illustrative slots 140 of FIG. 5 may electrically isolate different portions of housing 12 from each other and thereby allow these portions of housing 12 to serve as conductive structures in antennas (e.g., resonating element arms in inverted-F antennas, portions of slot antennas, resonating element structures in hybrid antennas, antenna ground structures, etc.) for cellular telephone bands, wireless local area network bands, satellite navigation system bands, other bands between 700 MH and 2700 MHz, and/or other suitable frequencies. Because slots 140 are filled with dielectric, these slots or other dielectric openings in a metal housing can also serve as antenna windows for antennas 40 such as illustrative Yagi antenna 40 of FIG. 4. Yagi antennas such as these may operate at frequencies of 60 GHz, other extremely high frequencies (EHF) such as frequencies of 10-400 GHz (sometimes referred to as millimeter wave frequencies), or other suitable operating frequencies.

Figure 6:
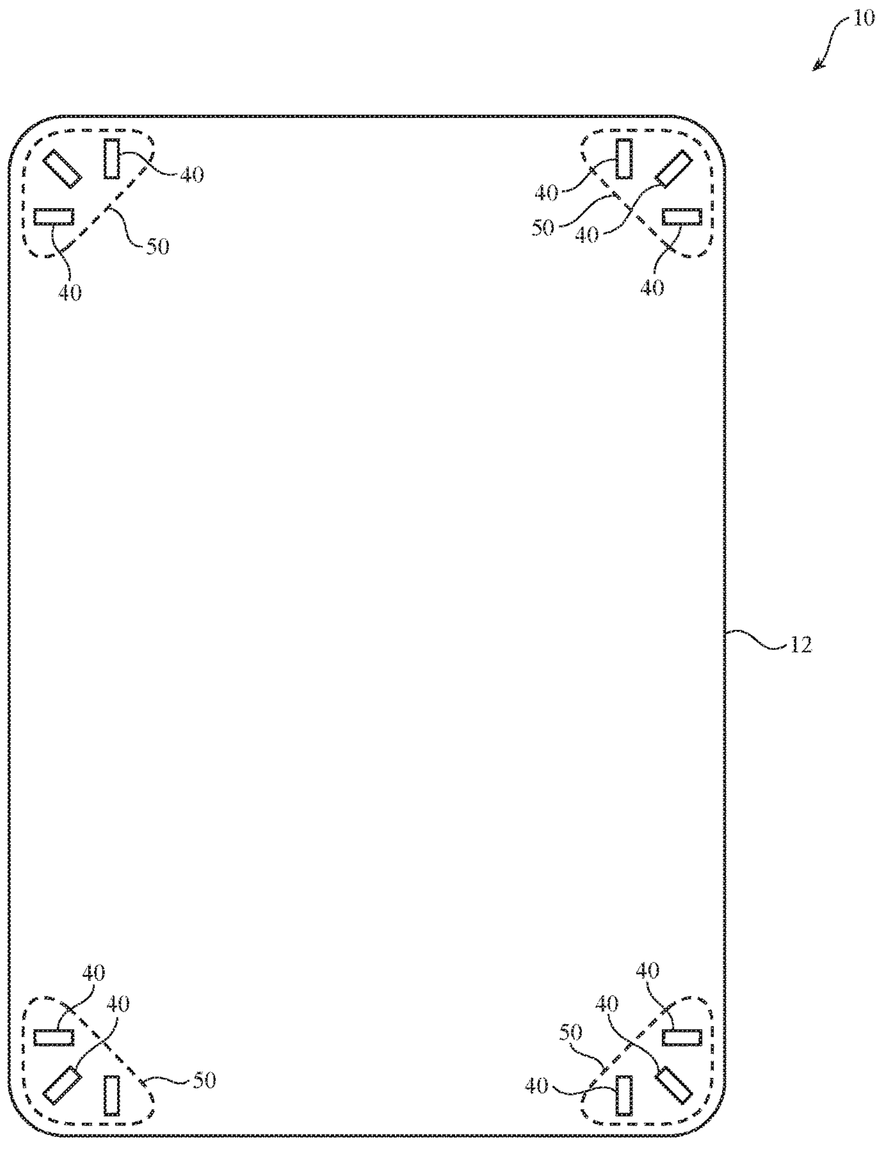
FIG. 6 is a rear view of an illustrative electronic device showing illustrative positions for antennas at the corners of the device in accordance with an embodiment.

FIG. 6 is a rear view of device 10 in an illustrative configuration in which each corner 50 of device 10 has been provided with a phased antenna array formed from multiple antennas. In the example of FIG. 6, each corner has an array formed from three respective antennas 40 oriented at 0°, 45°, and 90° so that adjacent antennas have radiation patterns that are oriented in directions separated by 45°, but the antenna array at each corner may have any suitable number of antennas (e.g., two or more, three or more, four or more, five or more six or more, two to five, three to five, three to eight, fewer than five, fewer than ten, etc.) and these antennas may be separated by any suitable angular amount (0-45°, 10-30°, more than 5°, less than 25°, less than 75°, etc.). Antennas 40 may be Yagi printed circuit board antennas and/or other suitable antennas. If desired, an array of patch antennas may be used to implement antennas 40 or each corner of device 10 may include both patch antennas and Yagi printed circuit board antennas. Configurations in which other types of antennas (e.g., dipoles, etc.) are used in forming antennas 40 for device 10 may also be used.

Dielectric-filled gaps in housing 12 such as dielectric-filled slots 140 of FIG. 5 may serve as antenna windows for antennas 40 of FIG. 6. Depending on operating conditions (e.g., blockage of antennas by external objects, device orientation towards or away from an external transceiver, etc.), control circuitry in device 10 may select appropriate antennas 40 to switch into use. As an example, if one of the three-antenna arrays (or an antenna array with another suitable number of antennas) of FIG. 6 exhibits good performance, the other three-antenna arrays may be turned off and the antenna array that is exhibiting good performance can be switched into use. Once operating in this way, beam steering operations may be performed with the array to further optimize performance. As another example, it may be determined that wireless performance can be optimized by switching one of antennas 40 into use (e.g., an antenna that is pointed towards external wireless equipment). In another possible configuration, a first antenna 40 from a first corner of device 10 and a second antenna 40 from a second corner of device 10 may be used (e.g., in a MIMO scheme). Other operations may be performed using antennas 40 if desired.

Figure 7:
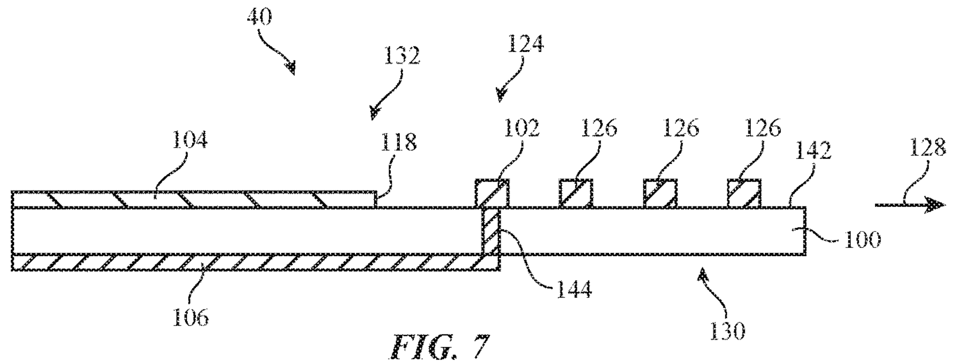
FIG. 7 is a cross-sectional side view of an illustrative printed circuit board Yagi antenna with a horizontal set of directors in accordance with an embodiment.
Figure 8:
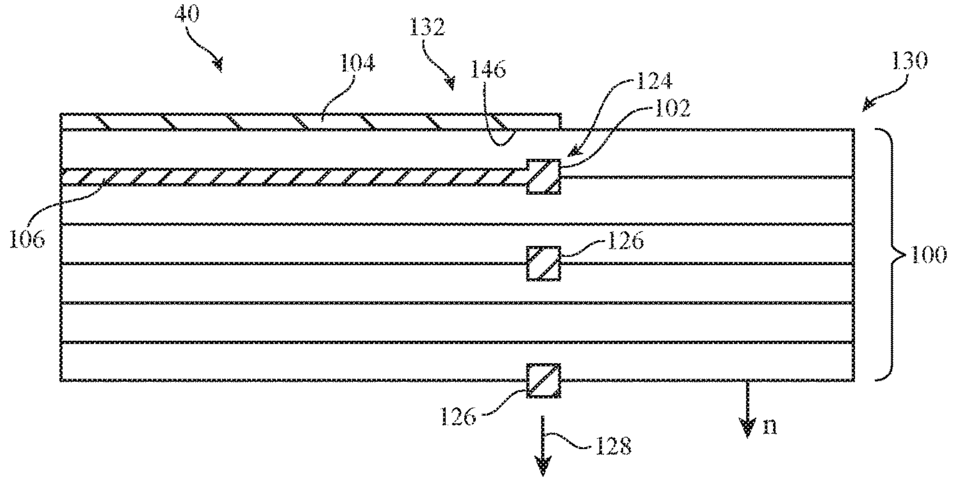
FIG. 8 is a cross-sectional side view of an illustrative printed circuit board Yagi antenna with a vertical set of directors in accordance with an embodiment.
Figure 9:
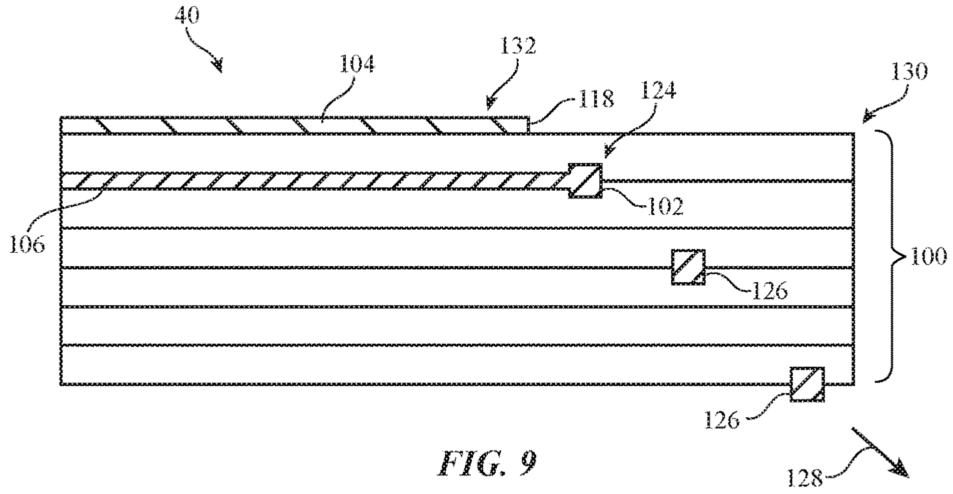
FIG. 9 is a cross-sectional side view of an illustrative printed circuit board Yagi antenna with a diagonal set of directors in accordance with an embodiment.

FIGS. 7, 8, and 9 are cross-sectional side views of antenna 40 showing illustrative configurations that may be used for directors 126 on printed circuit 130.

In the example of FIG. 7, antenna 40 has a reflector formed from ground plane 104 with reflector edge 118 running parallel to arms 102 of radiator 124 (i.e., into the page in the orientation of FIG. 7). Arms 102 may be coupled to the signal path formed from trace 106 using traces such as via 144. Printed circuit board substrate 100 of printed circuit board 130 may have a surface such as surface 142. Directors 126 may be mounted on surface 142 at different horizontal distances from radiator 102. Radiator 102 may be mounted on surface 142 between reflector 132 and directors 126. Using this type of planar arrangement (i.e., an arrangement in which reflector 132, radiator 124, and directors 124 lie in a common plane), the radiation pattern for antenna 40 may be oriented horizontally (e.g., transmitted signals from antenna 40 may propagate in horizontal direction 128 of FIG. 7 and incoming signals may be received in the reverse horizontal direction).

FIG. 8 shows how substrate 100 may have multiple dielectric layers (e.g., multiple layers of printed circuit board substrate material such as multiple layers of fiberglass-filled epoxy). With this type of arrangement, directors 126 may be embedded within the layers of substrate 100 (e.g., different directors 126 may be formed between different respective pairs of substrate layers). Directors 126 of FIG. 8 are aligned on top of each other and extend vertically through printed circuit 130 in alignment with arms 102 of radiator 124 and reflecting surface 146 of ground layer 104 in reflector 132). As a result, the radiation pattern associated with antenna 40 is vertical (see, e.g., direction 128 of FIG. 8, which is parallel with lower surface normal n of printed circuit board 130 and substrate 100).

In the illustrative configuration of FIG. 9, directors 126 are embedded within multiple dielectric layers in substrate 100 and have a diagonal orientation that is diagonally aligned with edge 118 of reflector 132 and with arms 102 of radiator 124. With this configuration, antenna 40 exhibits a diagonally oriented radiation pattern (see, e.g., diagonal direction 128).

In general, antennas 40 can have layouts of the type shown in FIGS. 7, 8, and 9 and/or may have other suitable layouts. Each antenna 40 may be different in layout or some or all of antennas 40 may have the same layout. Antennas 40 may be formed on one or more common printed circuit boards or each antenna 40 may be formed on a separate printed circuit board.

Figure 10:
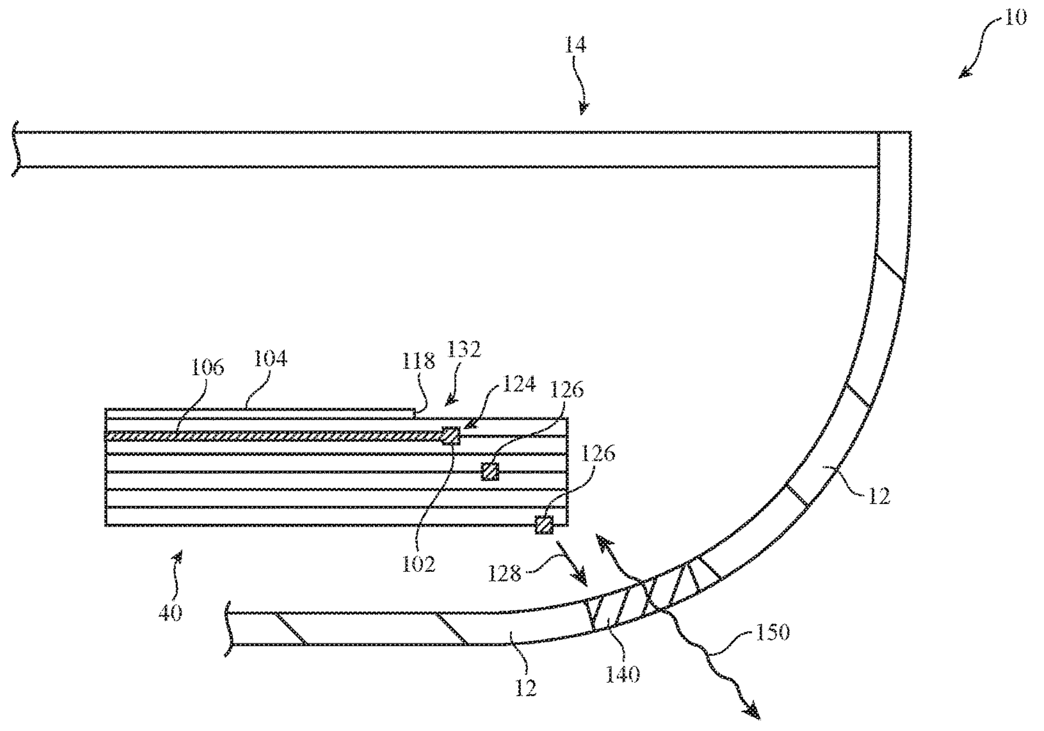
FIG. 10 is a cross-sectional side view of an illustrative electronic device showing how a Yagi antenna may have directors aligned with a dielectric gap in a metal device housing in accordance with an embodiment.

Antennas 40 can be mounted so that they radiate and receive signals through dielectric-filled openings in a metal housing (see, e.g., gaps 140 of FIG. 5) or through other dielectric structures associated with device 10. As shown in the cross-sectional side view of the end portion of illustrative device 10 of FIG. 10, for example, antenna 40 may have a diagonal radiation pattern formed by aligning directors 126, arms 102 of radiator 124, and edge 118 of reflector 132 diagonally. An antenna of this type may be mounted at a location within the interior of device 10 in which radiation pattern 128 is aligned with an antenna window structure in housing 12. As shown in FIG. 10, for example, radiation pattern 128 may be aligned with dielectric-filled slot 140 (FIG. 5). During operation, wireless signals 150 may be transmitted and received by antenna 40 through slot 140.

Figure 11:
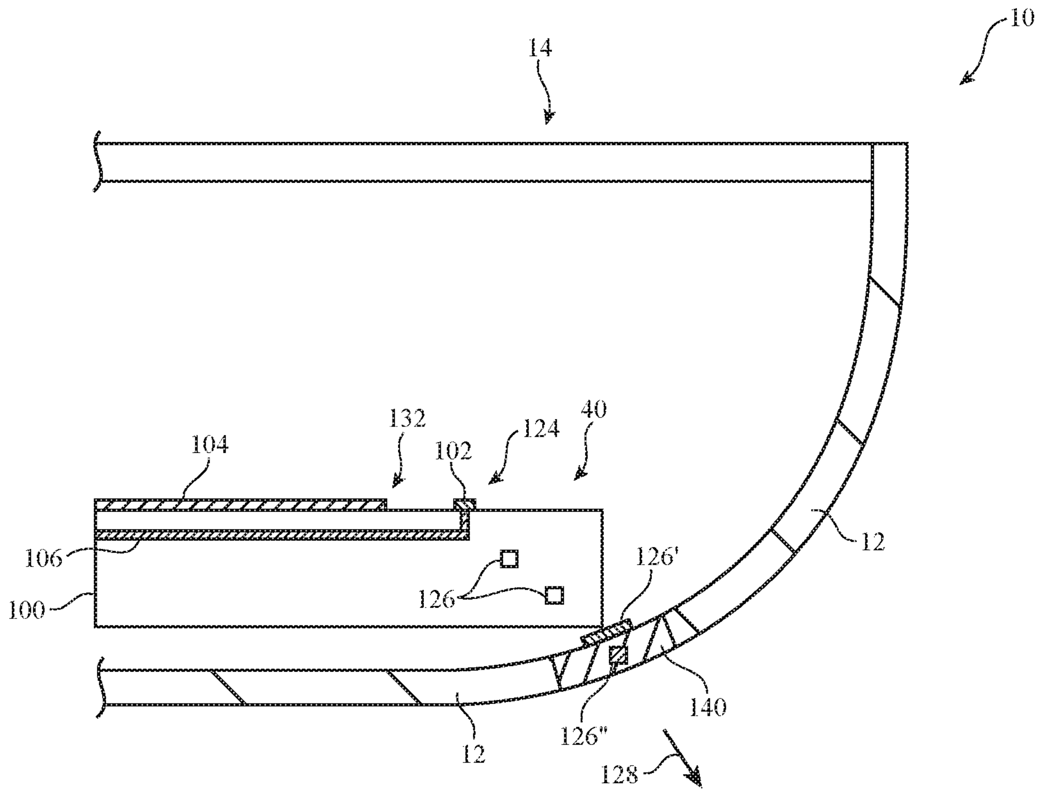
FIG. 11 is a cross-sectional side view of an illustrative electronic device showing how a director for an antenna may be embedded in dielectric in a metal device housing opening in accordance with an embodiment.

If desired, directors 126 may be embedded within the plastic or other dielectric in a slot or other opening in a metal electronic device housing. Consider, as an example, the arrangement of FIG. 11. In the example of FIG. 11, antenna 40 is a Yagi antenna having reflector 132, radiator 124, and directors 126. As shown in FIG. 11, one or more directors for antenna 40 may be supported by plastic or other dielectric within slot 140 or other dielectric-filled opening in housing 12 (e.g., a metal housing). In the FIG. 11 example, director 126" is embedded within the dielectric in slot 140. If desired, a director may be formed from a metal trace on an inner surface of the dielectric in slot 140 (see, e.g., illustrative director 126'). Configurations in which multiple directors are embedded within the dielectric in an opening in metal housing 12 and/or in which more than one director is supported on a surface of the dielectric in the opening in metal housing 12 may also be used. The arrangement of FIG. 11 is merely illustrative. Directors such as directors 126' and 126" may be machined metal members (e.g., machined strips of metal), patterned metal foil, metal traces deposited and patterned using laser patterning or other patterning techniques, wires, or other conductive structures.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:

a metal housing;

a dielectric-filled slot in the metal housing;

a printed circuit board antenna having a radiation pattern that is aligned with the dielectric-filled slot, wherein the printed circuit board antenna comprises a Yagi antenna; and millimeter wave transceiver circuitry that transmits and receives millimeter wave signals through the dielectric-filled slot using the printed circuit board antenna.

2. The electronic device defined in claim 1 wherein the Yagi antenna comprises a radiator and at least one director.

3. The electronic device defined in claim 2 wherein the Yagi antenna comprises a reflector.

4. The electronic device defined in claim 1 wherein the Yagi antenna has a reflector, a radiator, and directors.

5. The electronic device defined in claim 4 wherein the printed circuit board antenna has a printed circuit board substrate with a surface and wherein the directors are formed from parallel strips of metal on the surface.

6. The electronic device defined in claim 4 wherein the printed circuit board antenna has a printed circuit board substrate with multiple dielectric layers and wherein the directors are embedded within the multiple dielectric layers.

7. The electronic device defined in claim 6 wherein the radiator has arms, the arms of the radiator and the directors are vertically aligned so that the radiation pattern extends vertically and parallel to a surface normal of the printed circuit board substrate, and the reflector includes a layer of metal on the printed circuit board that overlaps the arms of the radiator.

8. The electronic device defined in claim 6 wherein the radiator has arms, the arms of the radiator and the directors are diagonally aligned so that the radiation pattern extends diagonally with respect to a surface normal of the printed circuit board substrate, and the reflector comprises a layer of metal with a reflector edge that is diagonally aligned with the arms of the radiator and the directors.

9. The electronic device defined in claim 1 wherein the millimeter wave transceiver circuitry is configured to transmit and receive millimeter wave signals at 60 GHz using the printed circuit board antenna and wherein the printed circuit board antenna comprises a Yagi antenna having a reflector, a radiator, and directors.

10. The electronic device defined in claim 1 further comprising a director on the dielectric-filled slot.

11. The electronic device defined in claim 1 further comprising a director embedded within the dielectric-filled slot.

12. The electronic device defined in claim 1 further comprising a director selected from the group consisting of: a director on the dielectric-filled slot and a director embedded within the dielectric-filled slot.

13. Apparatus, comprising:

a metal structure with a dielectric-filled opening; and at least one phased antenna array having an array of printed circuit board antennas aligned with the dielectric-filled opening that transmit and receive wireless signals through the dielectric-filled opening, wherein each of the printed circuit board antennas is formed from a printed circuit board substrate with metal traces configured to form a reflector, a radiator, and at least one director.

14. The apparatus defined in claim 13 further comprising a display, wherein the metal structure comprises an electronic device housing in which the display is mounted.

15. The apparatus defined in claim 14 wherein the printed circuit board antennas comprise millimeter wave Yagi antennas, the at least one phased antenna array comprises a plurality of phased antenna arrays each having a respective array of printed circuit board antennas aligned with a respective portion of the dielectric-filled opening in the metal structure, the electronic device housing has four corners, and the plurality of phased antenna arrays comprises a respective phased antenna array at each of the four corners.

16. The apparatus defined in claim 13, wherein the dielectric-filled opening is a single dielectric-filled opening and each of the printed circuit board antennas is aligned with the single dielectric-filled opening.

17. An electronic device, comprising:

a metal housing;

a dielectric-filled slot in the metal housing that electrically isolates at least two different portions of the metal housing from each other;

wireless transceiver circuitry; and printed circuit board Yagi antennas, wherein the wireless transceiver circuitry transmits wireless signals through the dielectric-filled slot with the printed circuit board Yagi antennas.

18. The electronic device defined in claim 17 wherein the wireless transceiver circuitry comprises millimeter wave transceiver circuitry and wherein the millimeter wave transceiver circuitry receives 60 GHz wireless signals with the printed circuit board Yagi antennas.

19. The electronic device defined in claim 18 wherein each of the printed circuit board Yagi antennas includes a printed circuit board substrate with multiple layers and includes directors that are formed from strips of metal embedded between different respective pairs of the layers.

20. The electronic device defined in claim 17, wherein the at least two different portions of the metal housing that are electrically isolated from each other by the dielectric-filled slot comprise a first portion of the metal housing that forms a resonating element arm for an inverted-F antenna and a second portion of the metal housing that forms an antenna ground structure.

* * * * *